United States Patent [19]

Kato et al.

[11] Patent Number: 4,690,872
[45] Date of Patent: Sep. 1, 1987

[54] CERAMIC HEATER

[75] Inventors: Norio Kato; Shunkichi Nozaki; Yukihiro Kimura; Rokuro Kambe, all of Aichi, Japan

[73] Assignee: NGK Spark Plug Co., Ltd., Japan

[21] Appl. No.: 876,643

[22] Filed: Jun. 16, 1986

Related U.S. Application Data

[63] Continuation of Ser. No. 661,880, Oct. 17, 1984, abandoned, which is a continuation of Ser. No. 510,138, Jul. 1, 1983, abandoned.

[30] Foreign Application Priority Data

Jul. 7, 1982 [JP] Japan ................................. 57-116809

[51] Int. Cl.$^4$ ............................ B32G 9/04; H05G 3/10
[52] U.S. Cl. ...................................... 428/446; 428/428; 428/698; 428/699; 252/518; 252/548; 219/548
[58] Field of Search ................ 219/548; 428/689, 698, 428/699, 428, 446; 427/255, 69

[56] References Cited

U.S. PATENT DOCUMENTS

| | | | |
|---|---|---|---|
| 2,882,187 | 4/1959 | Kwate | 428/428 X |
| 2,884,894 | 5/1959 | Ruppert et al. | 427/255 X |
| 3,119,717 | 1/1964 | Veres | 428/428 X |
| 3,189,477 | 6/1965 | Shaffer | 428/689 X |
| 3,264,135 | 8/1966 | Wakelyn et al. | 428/446 X |
| 3,286,312 | 11/1966 | Davis et al. | 428/446 X |
| 3,307,925 | 3/1967 | Jacobson | 428/661 X |
| 3,498,832 | 3/1970 | Wilson | 428/428 |
| 3,765,939 | 10/1973 | Reid | 427/255 X |
| 3,824,120 | 7/1974 | Davidge et al. | 428/446 |
| 3,895,219 | 7/1975 | Richerson et al. | 428/446 X |
| 4,039,997 | 8/1977 | Huang et al. | 428/446 X |
| 4,180,596 | 12/1979 | Crowder et al. | 427/255 X |
| 4,234,661 | 11/1980 | See et al. | 428/446 |
| 4,293,619 | 10/1981 | Sandingham et al. | 428/661 X |
| 4,337,476 | 6/1982 | Fraser et al. | 428/446 X |
| 4,486,651 | 12/1984 | Atsumi et al. | 252/518 X |
| 4,493,789 | 1/1985 | Veyama et al. | 252/518 X |
| 4,499,366 | 2/1985 | Yoshida et al. | 252/518 X |
| 4,520,342 | 5/1985 | Vugts | 252/518 X |
| 4,555,358 | 11/1985 | Matsushita et al. | 428/446 X |

Primary Examiner—Nancy A. Swisher
Attorney, Agent, or Firm—Sughrue, Mion, Zinn, Macpeak and Seas

[57] ABSTRACT

A ceramic heater comprising a ceramic substrate is described which has formed thereon a layer of a silicide of an element selected from groups IVa, Va and VIa of the periodic table. The heater has stable temperature vs. resistance characteristics, has high mechanical strength and produces the desired temperature in a very short period of time.

8 Claims, 2 Drawing Figures

CERAMIC HEATER

This is a continuation of application Ser. No. 661,880, filed 10/17/84, which is a continuation of application Ser. No. 510,138, filed July 1, 1983, both now abandoned.

FIELD OF THE INVENTION

The present invention relates to a ceramic heater that generates heat from the surface thereof.

BACKGROUND OF THE INVENTION

A cenventional ceramic heater comprising a ceramic substrate consists of an alumina substrate having a heat-generating pattern of tungsten- or molybdenum-containing paste formed thereon by metallizing. However, such a heater has a significant problem: when it is used at very high temperature (i.e., at least 1,000° C.), the electrical resistance of the heating surface is increased because the metal on the surface is gradually diffused into the substrate. To solve this problem, it has been proposed to embed the tungsten- or molybdenum-heating element in the ceramic substrate. However, the resulting heater has low mechanical strength because the substrate has embedded therein a material that is foreign to that substrate; furthermore, it takes additionally several seconds for the surface of the heater to reach a predetermined temperature since there is required a period of time for heat generated by the heating element embedded in the heater to conduct to the surface of the heater.

SUMMARY OF THE INVENTION

Therefore, a primary object of the present invention is to provide a ceramic heater that has stable temperature vs. resistance characteristics, has high mechanical strength, and produces a desired temperature in a very short period of time.

This object can be achieved by a ceramic heater comprising a ceramic substrate which has formed thereon a layer of a silicide of an element selected from groups IVb, Vb and VIb (i.e., Ti, Zr, Hf, V, Nb, Ta, Cr, Mo, and W) of the Periodic Table. Combinations of silicides may be used if desired.

DETAILED DESCRIPTION OF THE INVENTION

The metallizing is generally employed where an undercoating layer is applied on the surface of an alumina substrate, and then a metal layer is formed on the undercoated alumina substrate. The application method is described, for example, in Walter H. Kohl, Handbook of Materials and Techniques for Vacuum Devices, pp 441~451, wherein molybden-manganese-containing paste is applied on an alumina substrate and the thus obtained product is heated in a furnace at 1350° to 1550° C. to form an alumina ceramic having a metallizing surface. Generally, on the metallizing surface is brazed a metal such as 29% Ni-17% Co-Fe alloy or 42% Ni-Fe alloy with silver brazing filler metal.

The electrically conductive part of the ceramic heater of the present invention is not made of a metal, but rather is made of a silicide that is resistant to oxidation. Therefore, the heater of the present invention is less likely to be oxidized even at elevated temperatures. In addition, the heater of the present invention is improved in stability of electrical resistance. The electrically conductive layer is formed on a ceramic substrate either by physical vapor deposition or chemical vapor deposition, so the conductive layer is firmly adhered to the substrate and will not be easily separated after repeated heating-cooling cycles. The heater of the present invention has the heating section formed on its surface, which therefore becomes hot at a practicably fast rate. As a further advantage, silicides of tungsten, molybdenum and other elements of groups IVb, Vb and VIb of the periodic table have positive temperature vs. resistance characteristics, so their resistance is increased at elevated temperatures. This self-controlling capability of the silicide provides the heater of the present invention with ideal characteristics.

Figure 1:
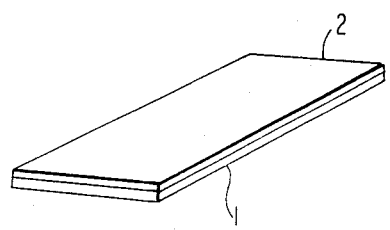
FIG. 1 is a perspective view of a heater according to the present invention.
Figure 2:
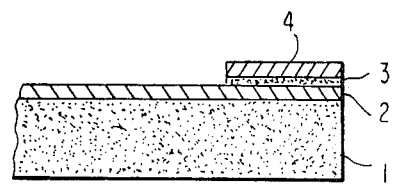
FIG. 2 is a partial cross section of the heater of FIG. 1 showing an electrode through which an electrical current is applied to the heater.

The structure of the ceramic heater of the present invention is hereunder described more specifically by refefence to the accompanying drawings, wherein FIG. 1 shows a perspective view of the heater comprising a ceramic substrate 1 having an electrically conductive vapor-deposited film 2 formed thereon, and FIG. 2 illustrates the structure of a copper electrode 4 which is formed on the conductive vapor-deposited film 2 through a silver paste layer 3. A current is applied to the heater through this electrode.

The heater of the present invention can be fabricated by forming the conductive film on a ceramic substrate by physical vapor deposition (e.g., electron beam deposition or sputtering, etc.) or chemical vapor deposition. Ceramic heaters produced by these methods are described in the following examples. In the examples, tungsten and molybdenum were selected as elements to make conductive silicide films, but it is to be understood that silicides of other elements of groups IVb, Vb and VIb of the periodic table can be usefully employed also.

EXAMPLE 1

Electron beam deposition

Molybdenum and silicon were vaporized in the same bell jar with electron beams and were alternately condensed on an alumina substrate (300° C.) at a pressure of less than $10 \times 10^{-6}$ Torr. The molybdenum film and the silicon film were alternatively five times deposited at 800 Å and 3200 Å respectively. The alumina substrate consists of 98% by weight of $Al_2O_3$ and balance of $SiO_2$, MgO and CaO, and has a flexural strength of 40 kg/mm$^2$ and a coefficient of thermal expansion of $8 \times 10^{-6}$ (25°~800° C.). When the deposited film attained a thickness of about 2 μm, the substrate was transferred into an argon atmosphere where it was heated at 1,000° C. for 30 minutes to thereby form a pure molybdenum silicide film. Four other samples were prepared by repeating the same procedure, except that the heat treatment in the argon atmosphere was conducted at 1,200° C., 1,350° C., 1,420° C. and 1,500° C., respectively.

An electric current was impressed on the five ceramic heater samples to increase their temperature to 1,000° C., at which temperature they were held for 3 minutes. Thereafter, they were cooled to room temperature. This heating and cooling cycle was repeated 1,000 times, with no abnormalities being found in the conductive films, and all samples produced the same voltage and current values after each cycle.

EXAMPLE 2

Sputtering

A tungsten silicide film was formed at a thickness of about 5 μm on a silicon nitride substrate by a conventional sputtering technique. The sputtering technique is described, for example, in Carroll F. Powell, Josph H. Oxley, John M. Blocher, Jr., Vapor Deposition, p.p. 78~88, published by John Wiley & Sons, Inc. That is, the sputtering technique refers to a technique comprising hitting an algone ion at an element of anticathode to spring out the element and depositing the element on the surface of the desired material. The silicon nitride substrate consists of 80% by weight of $Si_3N_4$ and balance of $Al_2O_3$, $Y_2O_3$ and TiN and has a flexural strength of 80 kg/mm$^2$ and a coefficient of thermal expansion of $3.8 \times 10^{-6}$ (25°~1200° C.). The resulting heater was placed in a normal air atmosphere, and an electric current was impressed on the heater until its temperature reached 1,000° C., where the heater was held for 300 hours. Throughout the testing period, the heater retained the same voltage and current values, and no abnormalities were found in the sputtered film.

EXAMPLE 3

Chemical vapor deposition

The vapor of molybdenum disilicide formed at a thickness of about 7 μm by chemical gas-phase reaction at elevated temperatures was condensed on a silicon nitride substrate. The silicon nitride substance has the same composition as in Example 2. The resulting heater was placed in a normal air atmosphere, and, as in Example 2, an electric current was impressed on the heater until its temperature reached 1,000° C., at which the heater ws held for 300 hours. Throughout the testing period, the heater retained the same voltage and current values, and no abnormalities were found in the vapor-deposited film.

The electrical resistance of the ceramic heater of the present invention can be controlled by controlling the thickness of the vapor-deposited conductive film. The same result is obtained by forming a pattern of conductive film by masking the selected area of the substrate on which vapor deposition is not effected or by cutting notches in the vapor-deposited film formed throughout the substrate surface. In Examples 1 to 3, substrates in a flat sheet form were used, but it should be understood that substrates having cylindrical or other shapes may be readily coated with an electrically conductive film by vapor depositing techniques and can equally well be used as ceramic heaters.

Particularly, the ceramic heater of the present invention is useful for an igniter of gas utensils, a glow plug of Diesel engine, a cigar lighter installed in a car, an intake heater installed in a car or etc.

While the invention has been described in detail and with reference to specific embodiment thereof, it will be apparent to one skilled in the art that various changes and modifications can be made therein without departing from the spirit and scope thereof.

What is claimed is:

1. A ceramic heater comprising an alumina or silicon nitride ceramic substrate of high mechanical strength and an electrode through which current is applied attached thereto, wherein said ceramic substrate has formed thereon, by deposition, an electrically conductive layer consisting essentially of a silicide of an element selected from groups IVb, Vb and VIb of the Periodic Table.

2. A ceramic heater as in claim 1 wherein the silicide is that of an element selected from Group VIb of the Periodic Table.

3. A ceramic heater as in claim 1 wherein the layer is formed of molybdenum silicide.

4. A ceramic heater as in claim 1 wherein the layer is formed of tungsten silicide.

5. A ceramic heater as in claim 1, wherein the layer is formed by vapor deposition.

6. A ceramic heater as in claim 5, wherein the layer is formed by physical vapor deposition.

7. A ceramic heater as in claim 5, wherein the layer is formed by chemical vapor deposition.

8. A ceramic heater as claimed in claim 1, wherein said electrically conductive layer has a thickness of from about 2 to 5 μm.

* * * * *